(12) United States Patent
Johnson et al.

(10) Patent No.: US 6,194,967 B1
(45) Date of Patent: *Feb. 27, 2001

(54) CURRENT MIRROR CIRCUIT

(75) Inventors: Luke A. Johnson, Tempe; Rizwan Ahmed, Chandler, both of AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/099,081

(22) Filed: Jun. 17, 1998

(51) Int. Cl.$^7$ ........................................................ H03F 3/04
(52) U.S. Cl. .............................. 330/288; 330/85; 323/315
(58) Field of Search ..................... 330/288, 85; 323/315, 323/316

(56) References Cited

U.S. PATENT DOCUMENTS

| | | | |
|---|---|---|---|
| 4,064,463 | * 12/1977 | Leidich | 330/257 |
| 4,412,186 | * 10/1983 | Nagano | 330/288 |
| 4,605,907 | * 8/1986 | Rosenthal et al. | 330/257 |
| 5,087,891 | * 2/1992 | Cytera | 330/288 |
| 5,134,310 | * 7/1992 | Mobley et al. | 307/270 |
| 5,212,458 | * 5/1993 | Fitzpatrick et al. | 330/288 |

OTHER PUBLICATIONS

Bult, Klaas and Govert J.G.M. Geelen, "A Fast–Settling CMOS Op Amp for SC Circuits with 90–dB DC Gain", *IEEE Journal of Solid–State Circuits*, vol. 25, No. 6, Dec. 1990, pp. 1379–1384.

Gray, Paul R. and Robert G. Meyer, *Analysis and Design of Analog Integrated Circuits*, published by John Wiely & Sons, 1984, pp. 270–285.

"High–Resolution, Current–Mode A/D Convertors Using Active Current Mirrors", *Electronic Letters*, vol. 24, No. 21, Oct. 1988, pp. 1331–1332.

* cited by examiner

*Primary Examiner*—Benny Lee
*Assistant Examiner*—Henry Choe
(74) *Attorney, Agent, or Firm*—Kenneth M. Seddon; Howard A. Skaist

(57) ABSTRACT

Briefly, in accordance with one embodiment of the invention, an integrated circuit includes an operational amplifier coupled in a circuit configuration. The circuit configuration includes two transistors coupled to the operational amplifier so that the corresponding voltages at the terminals or ports of the transistors are substantially identical. Briefly, in accordance with one more embodiment of the invention, an integrated circuit includes an operational amplifier coupled in a circuit configuration. The circuit configuration includes two circuit components coupled to the operational amplifier so that the corresponding voltages at the terminals or ports of the circuit components are substantially identical. The circuit components include any circuit components capable of implementing a transconductance.

22 Claims, 3 Drawing Sheets

CURRENT MIRROR CIRCUIT

BACKGROUND

1. Field

The present invention relates to current mirror circuits and, more particularly, to current mirrors that employ active feedback.

2. Background Information

Current mirrors are well-known circuit configurations. However, advances in the technology have resulted in changes and further improvements in current mirror circuit configurations. One such advance in the technology relates to lower voltages, such as, for example, the development of 1.8 volt semiconductor fabrication processes. In addition, it has become desirable in some circuit applications, such as, for example, circuits, devices, components, and/or systems that comply with the 1394A specification, Draft 2.0, dated Mar. 15, 1998, available from the Institute of Electrical and Electronic Engineers (IEEE), also available via the World Wide Web (WWW), at ftp://ftp.symbios.com/pub/standards/io/1394/P1394a/, (hereinafter "1394A"), to operate over a relatively broad range of voltages or voltage signal levels. Thus, the availability of current mirrors that may operate as accurate current sources in a low voltage environment has become desirable.

SUMMARY

Briefly, in accordance with one embodiment of the invention, an integrated circuit includes an operational amplifier coupled in a circuit configuration. The circuit configuration includes two transistors coupled to the operational amplifier so that the corresponding voltages at the terminals or ports of the transistors are substantially identical.

Briefly, in accordance with one more embodiment of the invention, an integrated circuit includes an operational amplifier coupled in a circuit configuration. The circuit configuration includes two circuit components coupled to the operational amplifier so that the corresponding voltages at the terminals or ports of the circuit components are substantially identical. The circuit components include any circuit component capable of implementing a transconductance.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
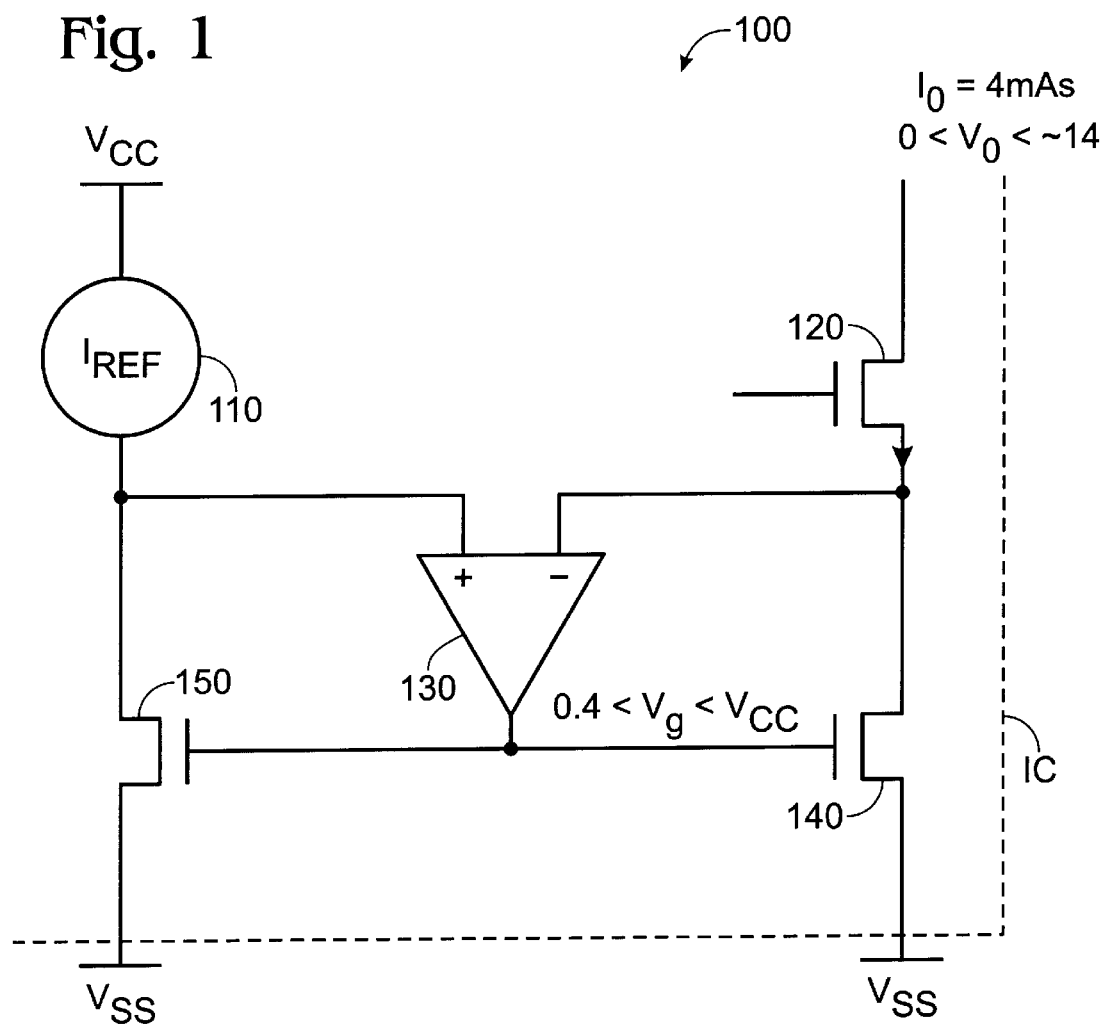
FIG. 1 is a circuit diagram illustrating an embodiment of a current mirror circuit in accordance with the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously indicated, the development of low voltage semiconductor manufacturing processes, as well as applications for devices and components produced using this technology, such as, for example, the 1394A specification, have resulted in a desire for current mirror circuit configurations having the capability to operate as accurate current sources in a relatively low voltage environment. For example, without limitation, for a current mirror intended to be employed in a component that would be useful as a device or in a system or circuit complying with the 1394A specification, it would be desirable for the current mirror circuit to deliver 4 milliamps (mAs) of current. However, with only 0.2 to 0.7 volts applied to the drain of the transistor, delivering 4 mAs of current may be a challenge. It is typically desirable in current mirror circuits for the transistor to operate in the saturation region. In this region, the output impedance is relatively large such that changes in the voltage at an output port or terminal, such as the drain, result in little change in the output current. However, to maintain a device in saturation in this particular application, the voltage applied to the gate of the transistor would desirably not exceed a relatively low drain voltage of approximately 0.2 volts by more than a threshold voltage, in this particular example, on the order of approximately 0.4 volts. It will, of course, be appreciated that the invention is not limited in scope to this particular application or to these particular voltage signal level values. Nonetheless, this provides one example of an embodiment of the invention that may be a desirable application. Therefore, in this example, the gate to source voltage may be on the order of approximately 0.6 volts. With a gate to source voltage having this relatively low voltage value, the ratio of the width-to-length of the semiconductor device, referred to hereinafter as "W/L," will typically be large to accommodate the relatively high 4 mAs current. For example, in some semiconductor fabrication processes, a W/L of around 4,000 might be employed. However, it is desirable that the current be relatively constant over a range of voltages, such as 0.2 volts to 0.7 volts. Therefore, it may be desirable to employ a long channel to increase the output impedance. For metal-oxide semiconductor (MOS) devices operating in the saturation region, the output impedance is dependent at least in part on an effect called channel length modulation. Basically, variations in the drain voltage may result in modulation of the electrical channel, resulting in a change in the output current. To reduce this effect, the device may be drawn with a long length. This results in the variation being a smaller percentage of the drawn size and the effective output impedance is increased proportionally. In order to accomplish this, a relatively long channel length of approximately 4 microns may be employed, resulting in a device size of approximately 16,000 microns. It would, of course, be desirable to reduce the channel length (and hence, total size). However, traditional techniques such as cascoding or employing a Wilson current mirror, typically will not provide a satisfactory solution because these approaches typically will not operate satisfactorily with a low voltage on the order of 0.2 volts, discussed above as desirable.

Figure 2:
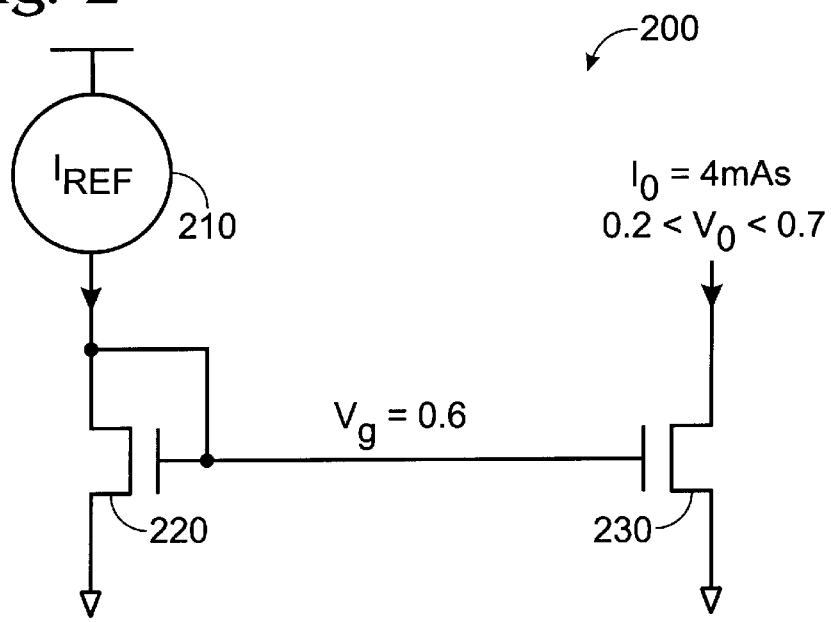
FIG. 2 is a circuit diagram illustrating an embodiment of a current mirror circuit.

FIG. 2 illustrates a "classical" current mirror circuit and, although it is possible to produce a device with a channel length of approximately 4 microns and a width of 16,000 microns, greater savings in the silicon device area would be desirable through use of a smaller size device. In addition, another issue associated with a current mirror circuit relates to current mismatch. As previously indicated, the gate to source voltage will be relatively low to maintain the transistors operating in the saturation region. However, variations in the threshold voltage, such as for different devices, may result in mismatching currents, such as for the current mirror illustrated in FIG. 2. For example, if the voltage applied to the gate is on the order of 0.6 volts and the threshold voltage is on the order of 0.4 volts, then (Vg-Vt) is on the order of 0.2 volts. However, the threshold voltage may vary by around 20 millivolts so that (Vg-Vt) may be on the order of 0.22 volts instead of 0.2 volts. As is well-known, the current through a saturated device is proportional to the square of (Vg-Vt). Therefore, this variation in the threshold voltage may result in a current mismatch on the order of 21%, which may degrade performance to an unacceptable level in some applications.

Figure 3:
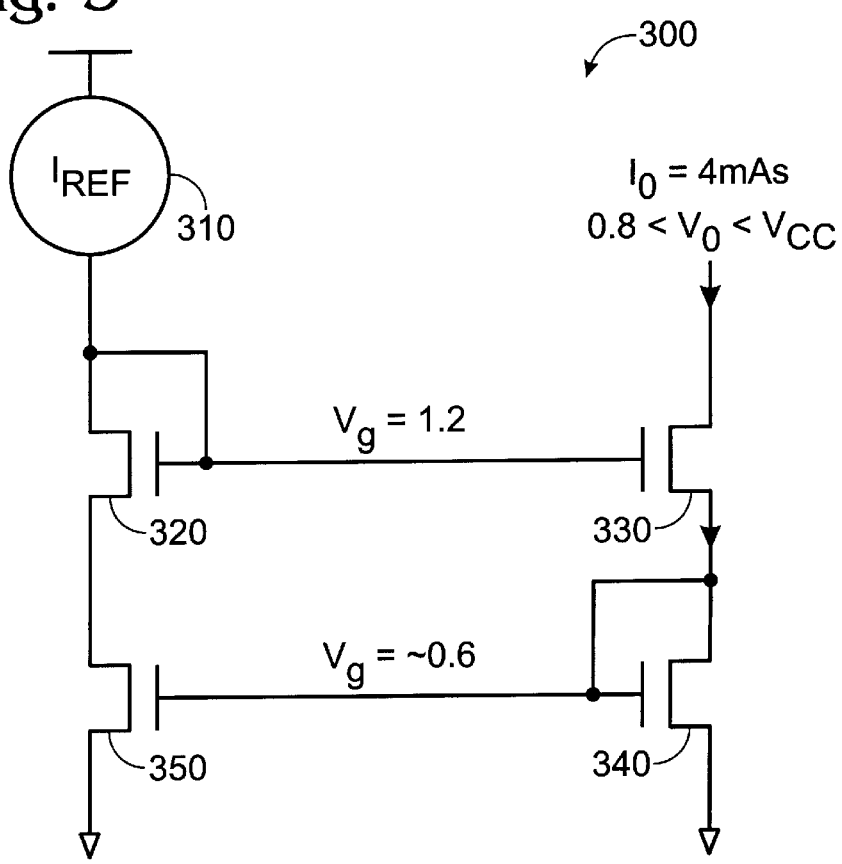
FIG. 3 is a circuit diagram illustrating another embodiment of a current mirror circuit.

FIG. 3 illustrates yet another embodiment of a current mirror circuit, typically referred to as the Wilson current mirror. This particular embodiment of a Wilson current mirror uses negative feedback to increase the output impedance by a factor of approximately 2+gm*ro, as is well-known, where gm is the transistor transmittance and ro is its open loop output impedance. Since the impedance is increased through the gain loop, devices with a shorter channel length may be used. Although this current mirror reduces the size of the transistor employed to provide the desired amount of current, as illustrated in FIG. 3, this particular circuit configuration will not operate satisfactorily where the output voltage is on the order of 0.2 volts, as is desired in this particular embodiment.

Figure 4:
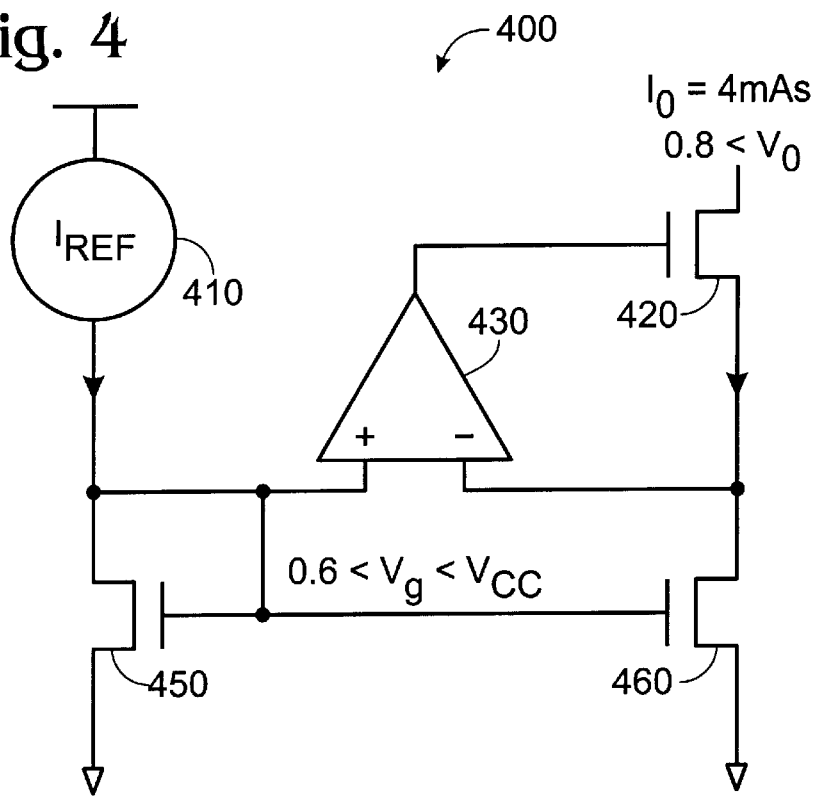
FIG. 4 is a circuit diagram illustrating yet another embodiment of a current mirror circuit.

FIG. 4 illustrates yet another embodiment of a current mirror circuit configuration. This particular embodiment employs active circuitry or active feedback to mirror the reference current. As illustrated in FIG. 4, the circuit employs an operational amplifier 430 and a source follower 420 to set the voltage on the drain of transistor 460 substantially equal to that of transistor 450. However, as with the Wilson current mirror, although this approach provides an accurate current, it will not operate satisfactorily at low voltages, such as an output voltage on the order of 0.2 volts. Furthermore, transistors 450 and 460 operate in the saturation region for satisfactory performance due, at least in part, to the diode configuration of transistor 450. This, therefore, may limit the output signal range and increase the susceptibility to device mismatching due to the square-law behavior of a device in saturation.

FIG. 1 is a circuit diagram illustrating an embodiment of a current mirror circuit in accordance with the present invention. The current mirror circuit of FIG. 1 is illustrated as embodied on an integrated circuit, although the invention is not limited in scope in this respect. This particular embodiment 100 includes an operational amplifier 130 coupled in a circuit configuration. The circuit configuration includes two transistors 140 and 150 coupled to the operational amplifier, 130, so that the voltages at the corresponding terminals or nodes of the transistors are substantially identical. As illustrated in FIG. 1, the input ports of operational amplifier 130 are coupled to the respective drains of transistors 140 and 150 and the output port of operational amplifier 130 is coupled to the gates of these transistors as well.

Of course, the invention is not restricted in scope to employing transistors. Any circuit component capable of implementing a transconductance will suffice. Furthermore, as shall be come more clear, a circuit component coupled so as to implement, for example, a voltage-controlled current or a voltage-controlled impedance may be employed in some embodiments.

In this particular embodiment, active circuitry is employed so that the terminals or nodes of the transistors have corresponding voltages that are substantially identical. If this is accomplished, then the two transistors will exhibit substantially identical current densities. The current then, in the mirroring device or transistor, will be substantially equal to the current of the reference transistor times the size ratio. This particular embodiment provides a number of advantages including significant current accuracy and achieving this accuracy with output voltages that are relatively low, and may, in some embodiments, even approach zero volts. Furthermore, this may be accomplished using transistors having a size in terms of silicon area less than the size that might be employed in a classical current mirror approach, which is illustrated in FIG. 2, for example.

In this particular embodiment, a current sink is described, although it will be appreciated by one skilled in the art that a similar approach may be employed to provide a current source embodiment. For example, current may be sourced from $V_{CC}$ through a P-channel metal oxide semiconductor (PMOS) transistor, whereas for the embodiment illustrated in FIG. 1, current is sinked to $V_{SS}$ through an N-channel MOS (NMOS) transistor, as described below. Likewise, this particular embodiment is illustrated employing a one-to-one ratio so that the current produced is substantially equal to the reference current. Of course, any suitable design ratio may be employed in alternative embodiments. Likewise, other transistors, such as, for example, a bipolar junction transistor (BPJT) or a junction field effect transistor (JFET), may be employed in alternative embodiments.

Figure 5:
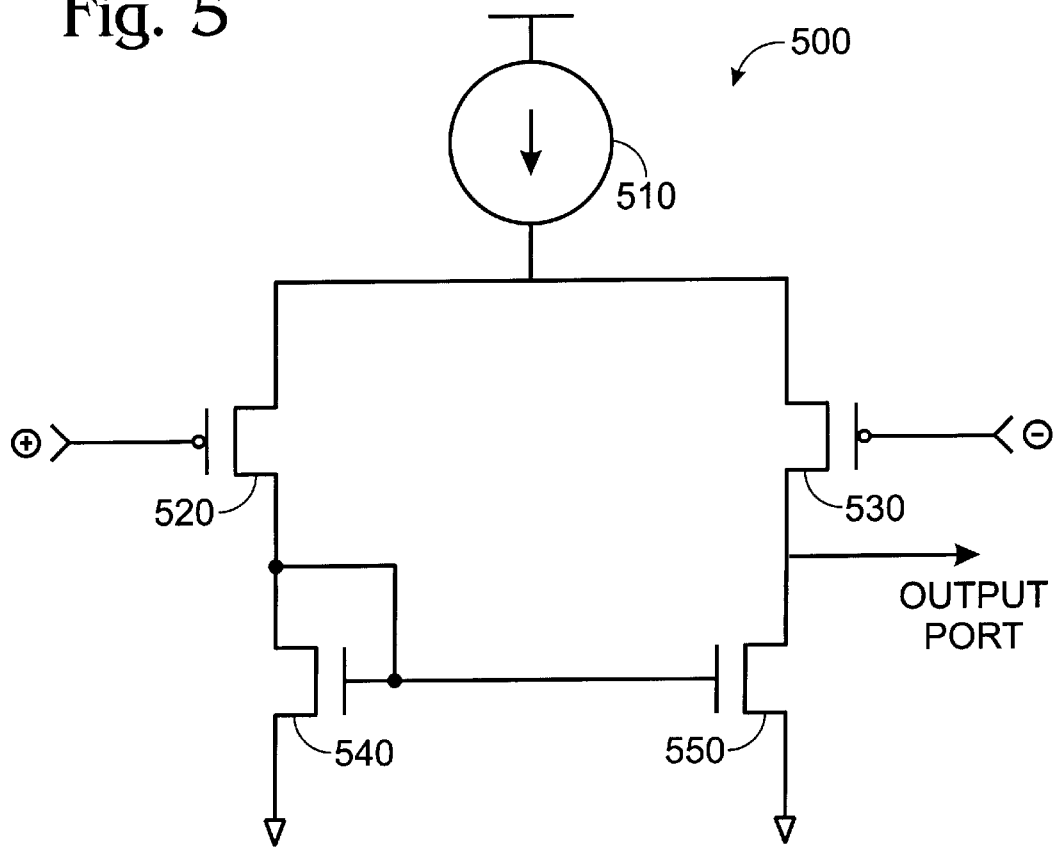
FIG. 5 is a circuit diagram illustrating an embodiment of an operational amplifier that may be employed in the embodiment of FIG. 1.

For the embodiment illustrated in FIG. 1, op amp 130 has a relatively low input and output voltage range. This may be accomplished, for example, by using a standard PMOS differential pair with an NMOS current mirror load, as illustrated in FIG. 5. Of course, this embodiment is provided only as an example and any one of a variety of different circuits may be employed. For example, instead of a single-sided op amp, in alternative embodiments, a double-sided op amp may be employed. Likewise, other variations may be employed and the invention is not restricted in scope to any particular circuit or type of op amp.

As illustrated in FIG. 1, op amp 130 drives the gates of both transistor 150 and mirror transistor 140. In this embodiment, the positive terminal of op amp 130 is coupled to the drain of reference transistor 150 and the negative terminal is coupled to the drain of mirror transistor 140. A nearly ideal current reference 110 is provided into the drain of transistor 150. This may be accomplished using a traditional current mirroring method, such as a cascode configuration or a Wilson configuration. A traditional approach may be satisfactory here in this embodiment because the current reference output voltage signal level occurs with respect $V_{CC}$ so that the output voltage is $V_{CC}$ minus a drain-to-source voltage across transistor 150. In this embodiment, this may be on the order of approximately 1.8 volts minus approximately 0.7 volts or approximately 1.1 volts. The drain of transistor 140 is coupled to the source of a transistor 120. Therefore, the impedance looking into this source is 1/gm (120), where gm (120) is the transmittance of transistor 120, which is on the order of kiloOhms. Since this impedance is relatively small compared to the output impedance of transistor 140, the parallel combination results in an impedance on the drain of transistor 140 of very nearly 1/gm (120) and the gain across this device, designated A1, is, therefore, approximately:

$$A1 = -gm\ (140) \times 1/gm\ (120), \quad [1]$$

where gm (140) is the transmittance of transistor 140.

The drain of transistor of 150 is coupled to the output port of the nearly ideal current reference. Since this is approximately an ideal current reference, the output impedance is relatively large, on the order of gigaohms. Since this impedance is much larger than ro (150), the output impedance of transistor 150, the parallel combinations results in an impedance very nearly equal to ro (150) and the gain across transistor 150, designated A0, is, therefore, approximately:

$$A0 = -gm\ (150) \times ro\ (150), \quad [2]$$

where gm (150) is the transmittance of transistor 150.
If the gain of op amp 130 is A3, then applying circuit analysis to determine the open loop gain of the circuit by breaking the loop at the op amp output port produces a gain of:

$$G = -A3 \times (A0 - A1) \quad [3]$$

Because A0 is significantly larger than A1, a negative feedback loop employing operational amplifier 130 has been accomplished. Where an operational amplifier is coupled in a negative feedback configuration, as illustrated in FIG. 1, the input ports of the operational amplifier have a "virtual short" so that the voltages applied to the two input terminals are driven to substantially equal voltages. Likewise, as illustrated in FIG. 1, the gates of transistor 150 and 140 are shorted together via a conductor. Furthermore, the sources of these transistors are both coupled to $V_{SS}$. Thus, the terminals of the two devices have substantially identical corresponding voltages applied to them. Thus, current sunk by transistor 140 is substantially equal to that being driven through transistor 150 from the nearly ideal mirror current reference. Furthermore, this relationship may be maintained over a variety of regions of operation of transistors 140 and 150.

In one embodiment, although the invention is not limited in scope in this respect, it may be desirable to operate the transistors in the triode region, as long as the output impedance of transistors 140 and 150 remain larger than that of the load on transistor 140. This maintains A0 greater than A1, which is desirable to accomplish negative feedback. Typically, a device in the triode or linear region of operation makes a relatively poor current source since it has electrical characteristics that resemble a resistor coupled to ground and the current typically has a linear relationship with changes in the drain voltage. In this particular embodiment, the op amp actively drives the gates of the two transistors, 140 and 150, such that the current is substantially maintained even when the drain voltage changes. The system, then has electrical characteristics that resemble a nearly ideal current source. One desirable feature of employing the triode region of operation is that a larger gate voltage results in a smaller W/L for a given current. In other words, for a given drain voltage and current, relatively speaking, the smallest device will be one operating in the triode region due to the large gate voltage. Another advantage of triode region operation is reducing the effect of transistor threshold voltage mismatch. The expression (Vg-Vt) is larger than that of a saturated device sinking a substantially equal amount of current. Therefore, changes in the threshold voltage, Vt, have a smaller effect on the Vg-Vt term and, hence, a smaller effect on the current. Furthermore, the current of a triode-region device is generally a function of (Vg-Vt), rather than $(Vg-Vt)^2$. Therefore, the current should change less for a given change in Vt for a device biased in the triode region then one that is operating saturation.

Regardless of the region of operation, the effective output impedance is augmented by the gain in the negative feedback loop. This reduces the effect of channel length modulation in the saturation region as well as resulting in the linear behavior of a triode device resemble a nearly ideal current source. In this embodiment, it may be possible to achieve performance matching a device having a W/L of 16,000 over 4 using a device with a W/L of 1,000 over 0.5. Therefore, an improvement in the silicon device area of as much as a factor of 1 over 100 may be accomplished in at least some embodiments.

One embodiment of a method of mirroring a current using an operational amplifier in accordance with the invention is as follows. The drain voltage of at least two respective transistors are applied to respective input ports of the operational amplifier, the operational amplifier being coupled in a negative feedback circuit configuration so as to approximately equalize the drain voltages, as illustrated in FIG. 1, for example. The at least two respective transistors are coupled in this embodiment in the negative feedback circuit configuration so as to approximately equalize voltages at corresponding terminals of the at least two respective transistors. In another embodiment, the output voltage of at least two respective circuit components may be applied to respective input ports of the operational amplifier, the operational amplifier being coupled in a negative feedback circuit configuration so as to approximately equalize the output voltages. The circuit components may include any circuit component capable of implementing a transconductance. As previously described, a voltage-controlled current source or a voltage-controlled impedance, for example, may be employed.

While certain features of the invention have been illustrated as described herein, many modifications, substitutions, changes and equivalents will now occur to those skilled in the art. For example, an embodiment in accordance with the invention may be implemented with bipolar transistors. It is, therefore, to be understood that the appended claims are intended to cover all such modifications and changes as fall within the true spirit of the invention.

What is claimed is:

1. An integrated circuit comprising:

an operational amplifier coupled in a circuit configuration;

the circuit configuration including two transistors coupled to the operational amplifier so that the voltages at the corresponding source terminals of the transistors are substantially identical, at lest one of the two transistors being an enhancement mode transistor;

wherein the circuit configuration includes an enhancement mode transistor, the enhancement mode transistor coupled to one of the input ports of the operational amplifier so that, in operation, one of said two transistors sinks or sources the current through the enhancement mode transistor.

2. An integrated circuit comprising:

an operational amplifier coupled in a circuit configuration;

the circuit configuration including two transistors coupled to the operational amplifier so that the voltages at the corresponding terminals of the transistors are substantially identical, at least one of the two transistor being an enhancement mode transistor;

an enhancement mode transistor, the enhancement mode transistor coupled to one of the input ports of the operational amplifier so that, in operation, one of said two transistors sinks or sources substantially all of the current through the enhancement mode transistor wherein the circuit configuration is coupled so that the current through at least one of the two transistors is on the order of at least approximately 4 milliamps and will remain substantially constant over a voltage range of 0.2 volts to 0.7 volts applied to the gate of the at least one of the two transistors.

3. The integrated circuit of claim 2, wherein the circuit configuration is coupled so that the voltage applied to the gate of the at least one of the two transistors comprises on the order of approximately 0.4 volts.

4. The integrated circuit of claim 1, wherein the input ports of said operational amplifier are coupled to the respective drains of said two transistors.

5. The integrated circuit of claims 4, wherein the output port of said operational amplifier is coupled to the gates of said two transistors.

6. The integrated circuit of claim 1, wherein said transistors comprise metal-oxide semiconductor (MOS) transistors.

7. The integrated circuit of claim 6, wherein said metal-oxide semiconductor transistors comprise negative metal-oxide semiconductor transistors.

8. The integrated circuit of claim 6, wherein said metal-oxide semiconductor transistors comprise positive metal-oxide semiconductor transistors.

9. The integrated circuit of claim 1, wherein said transistors comprise bipolar junction transistors (BJTs).

10. The integrated circuit of claim 1, wherein said transistors comprise junction field effect transistors (JFETs).

11. A circuit comprising:

an operational amplifier coupled in a circuit configuration;

the circuit configuration including two circuit components coupled to the operational amplifier so that the voltages at corresponding gate, source, and drain terminals of said circuit components are substantially identical, said circuit components comprising any circuit component capable of implementing a transconductance, wherein said circuit components are coupled so as to implement at least one of a voltage-controlled current and a voltage-controlled impedance; and an enhancement mode transistor having a source terminal coupled to an input of the operational amplifier.

12. A method of mirroring a current using an operational amplifier comprising:

applying the drain voltage of at least two respective transistors to respective input ports of the operational amplifier, the operational amplifier being coupled in a negative feedback circuit configuration so as to approximately equalize the drain voltages;

wherein the circuit configuration includes an enhancement mode transistor, the enhancement mode transistor being coupled to one of the input ports of the operational amplifier so that one of said two respective transistors sinks or sources substantially all of the current through the enhancement mode transistor.

13. The method of claim 12, wherein the at least respective two transistors are coupled in the negative feedback circuit configuration so as to approximately equalize voltages at corresponding terminals of the at least two respective transistors.

14. The method of claim 12, wherein the transistors comprise one of an NMOS transistor, a PMOS transistor, a JFET, and a BPJT.

15. The integrated circuit of claim 1, wherein said two transistors are coupled so as to operate in a triode region.

16. The integrated circuit of claim 3, wherein said two transistors are coupled so as to operate in a triode region.

17. The method of claim 12, wherein said two respective transistors are coupled so as to operate in a triode region.

18. A method of mirroring a current using an operational amplifier comprising:

applying the drain voltage of at least two respective transistors to respective input ports of the operational amplifier, the operational amplifier being coupled in a negative feedback circuit configuration so as to approximately equalize a drain voltages, wherein the current through at least one of the two transistors is on the order of at least approximately 4 milliamps, is substantially equal to the current through an enhancement mode transistor, and will remain substantially constant over a voltage range of 0.2 volts to 0.7 volts applied to the gate of the at least one of the two transistors.

19. The method of claim 18, wherein the voltage applied to the gate of the transistors comprises on the order of approximately 0.4 volts.

20. The method of claim 19, wherein the two transistors are coupled to operate in a triode region.

21. An integrated circuit comprising:

an operational amplifier coupled in a circuit configuration; and two transistors coupled to the operational amplifier so that the voltages at the gate, source, and drain terminals of the transistors are substantially identical; and an enhancement mode transistor having a source terminal coupled to an input of the operational amplifier.

22. The integrated circuit of claim 21, further comprising a an enhancement mode transistor, the enhancement mode transistor coupled the operational amplifier so that, in operation, one of said two transistors sinks or sources substantially all of the current through the enhancement mode transistor.

* * * * *